(12) United States Patent
Hung

(10) Patent No.: US 7,449,913 B1
(45) Date of Patent: Nov. 11, 2008

(54) PRE-DRIVER HAVING SLEW-RATE AND CROWBAR-CURRENT CONTROLS FOR A CMOS OUTPUT BUFFER

(75) Inventor: Kenneth Wai Ming Hung, Pak Shek Kok (HK)

(73) Assignee: Smartech Worldwide Limited, Hong Kong (CN)

( * ) Notice: Subject to any disclaimer, the term of this patent is extended or adjusted under 35 U.S.C. 154(b) by 34 days.

(21) Appl. No.: 11/765,751

(22) Filed: Jun. 20, 2007

(51) Int. Cl.
*H03K 17/16* (2006.01)
*H03B 1/00* (2006.01)

(52) U.S. Cl. .................. 326/27; 326/26; 326/83; 327/108; 327/112; 327/170; 327/207

(58) Field of Classification Search ............. 326/26–28, 326/82–86; 327/108, 112, 170, 205
See application file for complete search history.

(56) References Cited

U.S. PATENT DOCUMENTS

| | | | |
|---|---|---|---|
| 5,231,311 A | 7/1993 | Ferry | |
| 5,623,216 A * | 4/1997 | Penza et al. | 326/27 |
| 6,225,844 B1 * | 5/2001 | Fujiwara | 327/170 |
| 6,265,982 B1 * | 7/2001 | Ostwald | 340/683 |
| 6,459,325 B1 | 10/2002 | Hall | |
| 6,570,414 B1 | 5/2003 | Eker | |
| 6,653,873 B1 | 11/2003 | Nguyen | |
| 6,870,391 B1 * | 3/2005 | Sharpe-Geisler | 326/37 |
| 6,992,511 B2 | 1/2006 | Suzuki | |
| 7,019,551 B1 | 3/2006 | Biesterfeldt | |
| 7,208,984 B1 | 4/2007 | Petrofsky | |

\* cited by examiner

*Primary Examiner*—Vibol Tan
(74) *Attorney, Agent, or Firm*—Xin Wen

(57) ABSTRACT

An output buffer having slew-rate control and crossbar current control includes a pull-up PMOS transistor, a pull-down NMOS transistor, a pull-up network coupled to the gate of the pull-up PMOS transistor, and a pull-down network coupled to the gate of the pull-down NMOS transistor.

20 Claims, 7 Drawing Sheets

PRE-DRIVER HAVING SLEW-RATE AND CROWBAR-CURRENT CONTROLS FOR A CMOS OUTPUT BUFFER

BACKGROUND

The present invention relates to a pre-driver for an output buffer.

CMOS output buffers are widely used to drive external capacitive loading or external resistive loading, sometimes over a long distance. A CMOS output buffer usually includes a pull-up PMOS transistor and a pull-down NMOS transistor. The loading values for CMOS output buffers can vary across different applications. For this reason, it is required that the pull-up PMOS transistor and the pull-down NMOS transistor have high driving strengths, which are usually accomplished by large sizes in the PMOS and NMOS transistors.

The large sizes in the PMOS and NMOS transistors, however, create two major drawbacks for CMOS output buffers at the same time. One drawback is that when the output buffer switches voltage logic levels (from low to high, or vice versa), large current transient can pass through the bonding wires and create large power/ground bouncing noise or output bouncing noise. The voltage of bouncing noise can be characterized by the following equation:

$$V = L \, dI/dT \tag{1}$$

$$\text{Slew rate} = dV/dT \tag{2}$$

where L is the inductance of the bonding wire and/or the inductance from the PCB trace, I is the instantaneous current at time T, and V is the voltage induced by the instantaneous current across the inductor L at time T. dV/dT is referred to as the slew rate of the output buffer which is the rising or falling rate of the output voltage of the output buffer. If the voltage spike induced exceeds a logic threshold of the chip connecting to the output buffer during a logic level change, a logic fault will be created, which produces wrong data transmission. In order to minimize the voltage spike, conventional output buffers can include features for controlling the slew rate dV/dT and minimizing the voltage spike. One such feature includes a number of parallel transistors that can be sequentially turned on through delay elements to reduce the instantaneous current in the output buffer.

Another drawback associated with the large sizes of the PMOS and NMOS transistors is the large crow-bar current (shoot-through current) that can be produced between the voltage supply nodes VDD and VSS when the output buffer switches logic levels. During a logic level switch, it is likely that both the PMOS transistor and the NMOS transistor in the output buffer are turned on simultaneously, which can cause a large amount of current flowing through from VDD to VSS through the PMOS and the NMOS transistors. This current is called crowbar current (or shoot-through current). The crowbar current can increase dynamic current consumption, and shorten the battery lifetime for chips in portable devices.

Attempts have been made in output buffer designs to alleviate the above described drawbacks. U.S. Pat. No. 5,231,311 discloses a circuit having crowbar current control and slew rate control in an output buffer. However, the circuit includes an RC network with large resistor values to have good slew rate control between parallel PMOS transistors and NMOS transistors. The quick turn-off of the output buffer is accomplished by the diode bypass network. The turn-off of the output buffer is tied to VDD–VTHP for PMOS output transistors and VSS+VTHN for NMOS output transistors until the RC delayed gate node reaches VDD and VSS, respectively. Thus the pull-up/pull-down output transistors can operate below threshold for a short period of time while the pull-down/pull-up output transistors start operating. For such reason, it can be difficult to select the resistor values for resistors in the RC network.

U.S. Pat. Nos. 7,208,984, 6,653,873, and 6,570,414 describe methods for reducing crowbar currents without simultaneous slew rate control. U.S. Pat. Nos. 7,019,551 and 6,992,511 address controlling slew rates of output buffers but do not provide crowbar current control at the same time.

There is therefore a need to simultaneously address both above described drawbacks at the same time. It is also desirable for a design solution that is simple to implement and area efficient.

SUMMARY

In a general aspect, the present invention relates to an output buffer having slew-rate control and crossbar current control, including a pull-up PMOS transistor coupled to a high voltage supply terminal VDD and having a gate configured to receive a signal PUP; a pull-down NMOS transistor arranged between and the pull-up PMOS transistor and a low-voltage supply terminal VSS, wherein the gate of the pull-down NMOS transistor can receive a signal NDN; a pull-up network coupled to the gate of the pull-up PMOS transistor,; and a pull-down network coupled to the gate of the pull-down NMOS transistor. The pull-up network includes a first logic gate circuit having a threshold voltage VTHP for an input signal PPUP and configured to produce at least a portion of PUP; a first Schmitt trigger circuit configured to receive PUP as an input and output a signal FPUP, wherein the first Schmitt trigger circuit has a switching threshold voltage VSTP for PUP; and a second logic gate circuit having a threshold voltage substantially at VTHP for the input signal PPUP and configured to produce at least a portion of PUP, wherein the second logic circuit is enable controlled by the signal FPUP. The pull-down network includes a third logic gate circuit having a threshold voltage VTHN for an input signal PNDN and configured to produce at least a portion of NDN; a second Schmitt trigger circuit configured to receive NDN as an input and output a signal FNDN, wherein the second Schmitt trigger circuit has a switching threshold voltage VSTN for NDN; and a fourth logic gate circuit having a threshold voltage substantially at VTHN and an output connected to the gate of the pull-down NMOS transistor, wherein the fourth logic circuit is enable controlled by the signal FNDN.

In another general aspect, the present invention relates to an output buffer having slew-rate control and crossbar current control, including a pull-up PMOS transistor coupled to a high voltage supply terminal VDD and having a gate configured to receive a signal PUP; a pull-down NMOS transistor arranged between and the pull-up PMOS transistor and a low-voltage supply terminal VSS, wherein the gate of the pull-down NMOS transistor can receive a signal NDN; a pull-up network coupled to the gate of the pull-up PMOS transistor,; and a pull-down network coupled to the gage of the pull-down NMOS transistor. The pull-up network includes a first logic gate circuit having a threshold voltage VTHP for an input signal PPUP and configured to produce at least a portion of PUP; a first Schmitt trigger circuit configured to receive PUP as an input and output a signal FPUP, wherein the first Schmitt trigger circuit has a switching threshold voltage VSTP for PUP; and a second logic gate circuit having a threshold voltage substantially at VTHP for the input signal PPUP and configured to produce at least a portion of PUP, wherein the second logic circuit is enable controlled by the signal FPUP. The pull-down network includes a third logic gate circuit having a threshold voltage VTHN for an input signal PNDN and configured to produce at least a portion of NDN; a second Schmitt trigger circuit configured to receive NDN as an input and output a signal FNDN, wherein the second Schmitt trigger circuit has a switching threshold voltage VSTN for NDN; and a fourth logic gate circuit having a threshold voltage substantially at VTHN and an output connected to the gate of the pull-down NMOS transistor, wherein the fourth logic circuit is enable controlled by the signal FNDN. When DIN changes from logic high to logic low, the first logic gate circuit and the second logic gate circuit are configured to turn off the pull-up PMOS transistor before the third logic gate circuit and the fourth logic gate circuit turn on the pull-down NMOS transistor. When DIN changes from logic low to logic high, the third logic gate circuit and the fourth logic gate circuit are configured to turn off the pull-down NMOS transistor before the first logic gate circuit and the second logic gate circuit turn on the pull-up PMOS transistor.

In yet another general aspect, the present invention relates to an output buffer having slew-rate control and crossbar current, including a pull-up PMOS transistor coupled to a high voltage supply terminal VDD and having a gate configured to receive a signal PUP; a pull-down NMOS transistor arranged between and the pull-up PMOS transistor and a low-voltage supply terminal VSS, wherein the gate of the pull-down NMOS transistor can receive a signal NDN; a pull-up network coupled to the gate of the pull-up PMOS transistor,; and a pull-down network coupled to the gate of the pull-down NMOS transistor. The pull-up network includes a first logic gate circuit having a threshold voltage VTHP for an input signal PPUP and configured to produce at least a portion of PUP; a first Schmitt trigger circuit configured to receive PUP as an input and output a signal FPUP, wherein the first Schmitt trigger circuit has a switching threshold voltage VSTP for PUP; and a second logic gate circuit having a threshold voltage substantially at VTHP for the input signal PPUP and configured to produce at least a portion of PUP, wherein the second logic circuit is enable controlled by the signal FPUP. The pull-down network includes a third logic gate circuit having a threshold voltage VTHN for an input signal PNDN and configured to produce at least a portion of NDN; a second Schmitt trigger circuit configured to receive NDN as an input and output a signal FNDN, wherein the second Schmitt trigger circuit has a switching threshold voltage VSTN for NDN; and a fourth logic gate circuit having a threshold voltage substantially at VTHN and an output connected to the gate of the pull-down NMOS transistor, wherein the fourth logic circuit is enable controlled by the signal FNDN. The threshold voltages VTHN and VTHP satisfy the relationship: VTHN>VTHP and the switching threshold voltages VSTP and VSTN satisfy the relationship: VSTN>VSTP. The second Schmitt trigger circuit can shut off the fourth logic gate circuit when NDN exceeds the switching threshold voltage VSTN during a switch from logic high to logic low in DIN. The first Schmitt trigger circuit can shut off the second logic gate circuit when NDN falls below the switching threshold voltage VSTP during a switch from logic low to logic high in DIN.

Implementations of the system may include one or more of the following. The threshold voltages VTHN and VTHP can satisfy the relationship: VTHN>VTHP. The middle voltage between the high voltage supply terminal VDD and the low-voltage supply terminal VSS is VMID. The threshold voltages VTHN and VTHP can satisfy the relationship: VTHN>VMID>VTHP. The switching threshold voltage VSTP for the first Schmitt trigger circuit and the switching threshold voltage VSTN for the second Schmitt trigger circuit can satisfy the relationship: VSTN>VSTP. The switching threshold voltage VSTP and the switching threshold voltage VSTN can satisfy the relationship: VSTN>VMID>VSTP, VSTN, VTHN, VTHP, and VSTP can satisfy the relationship: VSTN>VTHN>VTHP>VSTP. The first logic gate circuit can include a first inverter having the threshold voltage VTHP; and a second inverter sequentially connected with the first inverter, wherein the second inverter includes an output connected to the gate of the pull-up PMOS transistor. The second logic gate circuit can include a first inverter having the threshold voltage VTHP; and a second inverter sequentially connected with the first inverter, wherein the second inverter includes an output connected to the gate of the pull-up PMOS transistor, and wherein the second inverter is connected between the high voltage supply terminal VDD and the low-voltage supply terminal VSS via one or more transistors that are controlled by the signal FPUP. The third logic gate circuit can include a first inverter having the threshold voltage VTHN; and a second inverter sequentially connected with the first inverter, wherein the second inverter includes an output connected to the gate of the pull-down NMOS transistor The fourth logic gate circuit can include a first inverter having the threshold voltage VTHN; and a second inverter sequentially connected with the first inverter, wherein the second inverter includes an output connected to the gate of the pull-down NMOS transistor, and wherein the second inverter is connected between the high voltage supply terminal VDD and the low-voltage supply terminal VSS via one or more transistors that are controlled by the signal FNDN. At least one of the first Schmitt trigger circuit or the second Schmitt trigger circuit can be enabled or disabled by an external enable signal EN. The output buffer can further include a fifth logic gate circuit configured to receive an input signal DIN and an external enable signal EN, to output a signal PPUP to the first logic gate circuit and the second logic gate circuit, and a output the signal PNDN to the third logic gate circuit and the fourth logic gate circuit; and an output pad connected to the pull-up PMOS transistor and the pull-down NMOS transistor, wherein the output pad is configured to provide output signal DOUT adapted to an external load in response to the input signal DIN and the external enable signal EN. When DIN changes from logic high to logic low, the first logic gate circuit and the second logic gate circuit can turn off the pull-up PMOS transistor before the third logic gate circuit and the fourth logic gate circuit turn on the pull-down NMOS transistor. When DIN changes from logic low to logic high, the third logic gate circuit and the fourth logic gate circuit can turn off the pull-down NMOS transistor before the first logic gate circuit and the second logic gate circuit turn on the pull-up PMOS transistor. The second Schmitt trigger circuit can shut off the fourth logic gate circuit when NDN exceeds the switching threshold voltage VSTN during a switch from logic high to logic low in DIN. The first Schmitt trigger circuit can shut off the second logic gate circuit when NDN falls below the switching threshold voltage VSTP during a switch from logic low to logic high in DIN.

Embodiments may include one or more of the following advantages. An advantage of the disclosed pre-driver circuit for output buffer is that it can simultaneously control slew rate and crowbar current in a CMOS output buffer. The disclosed pre-driver circuit for CMOS output buffer has a simple design and is easy to implement. The disclosed pre-driver circuit can also be easily integrated with or removed from an existing output buffer circuit. The present pre-driver can be register-controlled by a microprocessor or a microcontroller independently without affecting normal function of output buffer. The disclosed pre-driver circuit for CMOS output buffer can be implemented in small component areas, which is beneficial for high-density integrated circuit.

Another advantage of the disclosed pre-driver circuit is that the disclosed pre-driver circuit for CMOS output buffer can be implemented using only digital components, which can alleviate the need for precise analog components in some conventional output buffer.

Another advantage of the disclosed pre-driver circuit is that the operations of the disclosed pre-driver circuit do not require precise control of the absolute values for the buffer thresholds and the Schmitt trigger thresholds. Only the relative sequence of the threshold voltages and the voltage differences between the threshold voltages need to be controlled.

Although the invention has been particularly shown and described with reference to multiple embodiments, it will be understood by persons skilled in the relevant art that various changes in form and details can be made therein without departing from the spirit and scope of the invention.

BRIEF DESCRIPTION OF THE DRAWINGS

The following drawings, which are incorporated in and form a part of the specification, illustrate embodiments of the present invention and, together with the description, serve to explain the principles of the invention.

DETAILED DESCRIPTION

Figure 1:
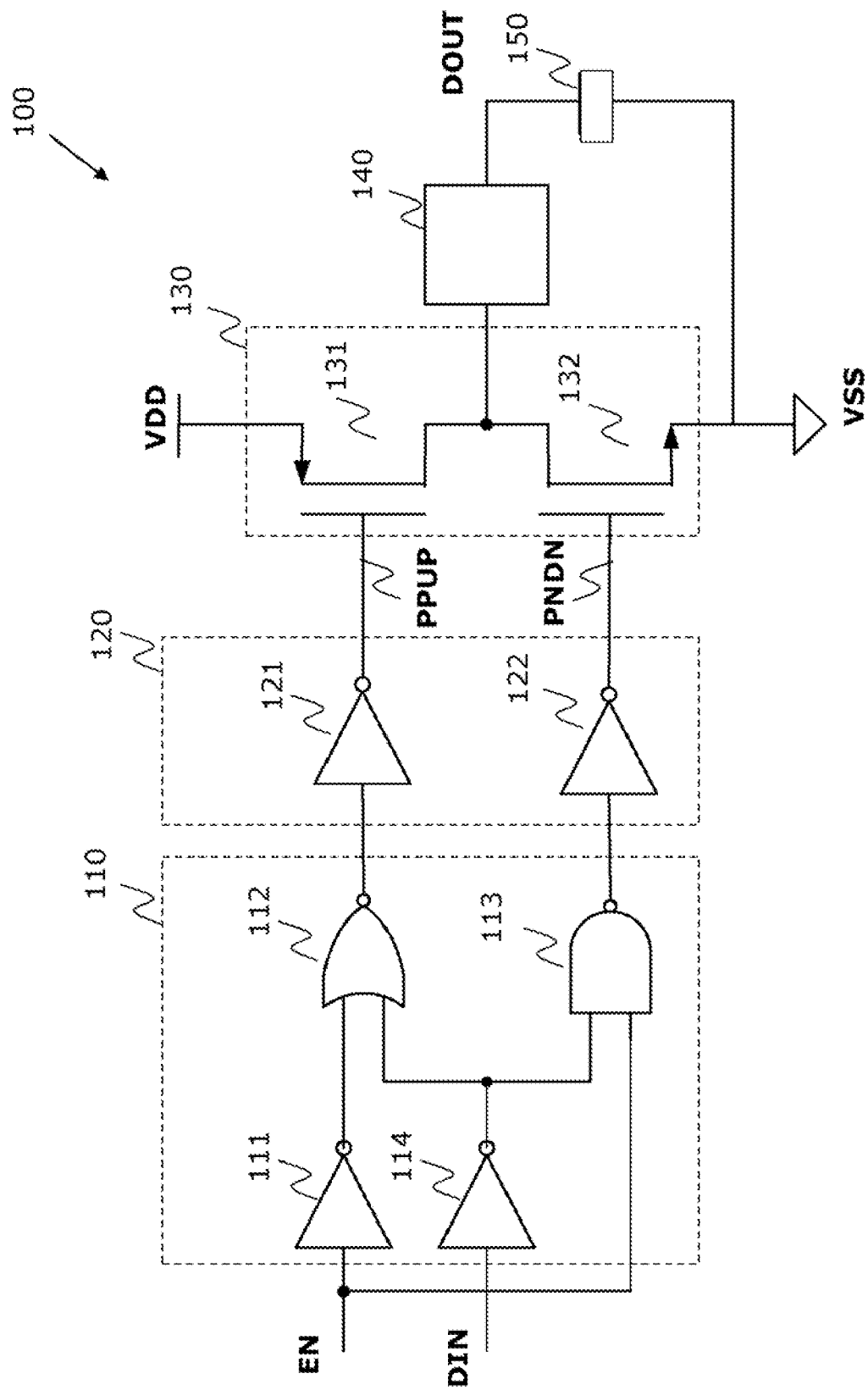
FIG. 1 illustrates an output buffer circuit.

FIG. 1 illustrates an output buffer 100 that can include several circuit blocks: a pre-driver logic 110, an inverting buffer circuit 120, output transistors 130, an output pad 140, and an external load 150. The pre-driver logic 110 and the inverter buffer circuit 120 can be referred to as pre-driver to the output buffer. The pre-driver logic 110 includes gates 111-114 that can receive a control signal EN and a data signal DIN. The inverting buffer circuit 120 includes inverters 121, 122 that can invert the output signals of the pre-driver logic 110 and buffers the inverted signals to the output transistors 130. The output transistors 130 includes a PMOS transistor 131 that can source current from VDD to output, and an NMOS transistor 132 that can sink current from output to VSS. The PMOS transistor 131 can be called a pull-up transistor. The PMOS transistor 132 can be called a pull-down transistor. The output pad 140 normally connects to the external environment through bonding wire. The external load 150 can be capacitive, resistive, or a combination thereof, depending on the specific applications.

The output buffer 100 is disabled when EN is logic low. The output of the inverter gate 111 is high. The output of NOR gate 112 is at logic low. The output of the NAND gate 113 is at logic high. The output of the inverter gate 121 becomes logic high. The output of inverter gate 122 becomes logic low. As a result, the output PMOS transistor 131 is turned off because its gate node is tied to logic high. The output NMOS transistor 132 is also turned off because its gate node is tied to logic low. The output node DOUT is at high impedance.

The output buffer 100 is enabled when EN is at logic high. For DIN at logic low/high, the inverter gate 114 outputs logic high/low respectively. The output of the NOR gate 112 is respectively at logic low/high. The output of the NAND gate 113 is respectively at logic low/high. Thus the output of the inverter gate 121 becomes logic high/low and the output of inverter gate 122 becomes logic high/low. The output NMOS transistor 132 is turned on and the output PMOS transistor 131 is turned off when the outputs of the inverter gates 121 and 122 are both at logic low. The output PMOS transistor 131 is turned on and the output NMOS transistor 132 is turned off when the outputs of the inverter gates 121 and 122 are both at logic high. The output node DOUT is therefore at logic low/high following the low/high logic levels of DIN. DOUT at the high logic level sinks current from DOUT to VSS. DOUT at the low logic level sources current from the node VDD to the external capacitive load 150 through the output pad 140.

The signal that triggers logic level change at the gate of the output PMOS transistor 131 can be referred to as PPUP. The signal that triggers logic level change at the gate of the output NMOS transistor 132 can be referred to as PNDN. Since the pre-driver logic 110 and the inverting buffer circuit 120 do not include slew rate control or crowbar current control, the PPUP and PNDN signals can change logic levels very closely in time. A large source current can thus be generated from VDD to the output pad 140 or sink current from the output pad 140 to VSS, creating large voltage spike at VDD/VSS nodes and the output pad 140. Moreover, there may be a transient period when the output PMOS transistor 131 and the output NMOS transistor 132 are turned on simultaneously, which can create large crowbar current across from VDD to VSS and increase dynamic current consumption.

Figure 2:
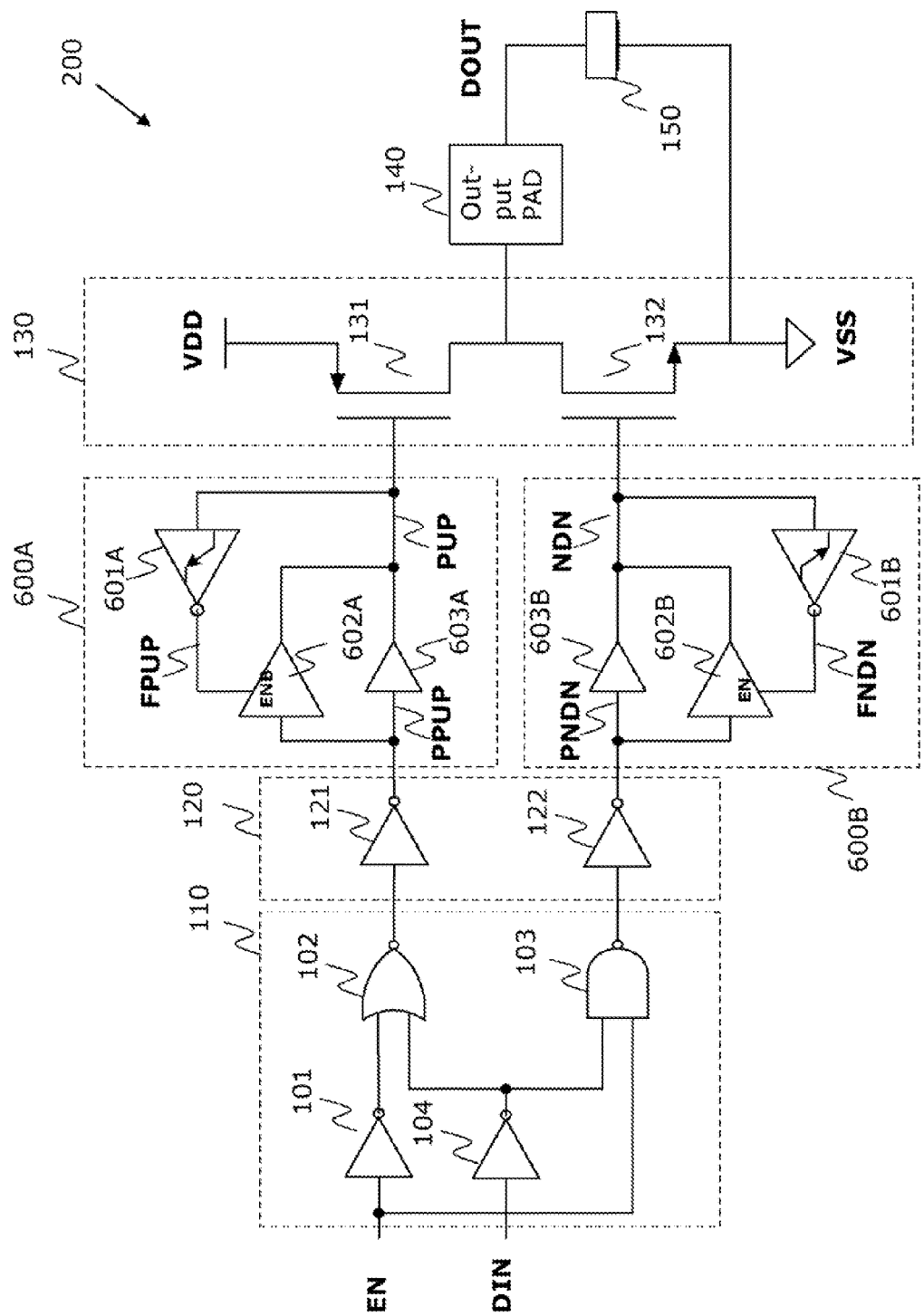
FIG. 2 illustrates an output buffer circuit in accordance with the present specification.

FIG. 2 illustrates an output buffer 200 in accordance with the present specification. The output buffer 200 can include several circuit blocks similar to the output buffer 100: a pre-driver logic 110, an inverting buffer circuit 120, output transistors 130, an output pad 140, and an external load 150. The output buffer 200 also includes a pull-up network 600A and a pull-down network 600B for slew rate control and crowbar current control. As discussed below, the pull-up network 600A and the pull-down network 600B can be implemented by simple designs and can be easily integrated into a standard digital output buffer without the use of precise analog circuits The pre-driver logic 110, the inverter buffer circuit 120, the pull-up network 600A, and pull-down network 600B form a pre-driver circuitry for the output transistors 130.

The pull-up network 600A includes a Schmitt trigger circuit 601A, a buffer circuit 602A with enable control, and a buffer circuit 603A without enable control. The pull-down network 600B includes another Schmitt trigger circuit 601B, another buffer circuit 602B with enable control, and another buffer circuit 603B without enable control. The purpose of the pull-up network 600A is to control the mechanism of turn on/off of the output PMOS transistor 131. The purpose of the pull-down network 600B is to control the mechanism of turn on/off of the output NMOS transistor 132.

The pre-driver logic 110 includes gates 111-114 that can receive a control signal EN and a data signal DIN. The inverting buffer circuit 120 includes inverters 121, 122 that can invert the output signals of the pre-driver logic 110. With the pull-up network 600A and the pull-down network 600B, the inverting buffer circuit 120 in the output buffer 200 can be implemented in much smaller sizes because the inverting buffer circuit 120 no longer needs to provide driving functions. The driving functions are now provided by the pull-up network 600A and the pull-down network 600B. The outputs of the inverters 121, 122 can be respectively input to the pull-up network 600A and the pull-down network 600B.

The PMOS transistor 131 can source current from VDD to output under the control of the pull-up network 600A. The NMOS transistor 132 can sink current from output to VSS under the control of the pull-down network 600B. The output pad 140 normally connects to the external environment through bonding wire. The external load 150 can be capacitive or resistive depending on the specific applications.

Figure 3A:
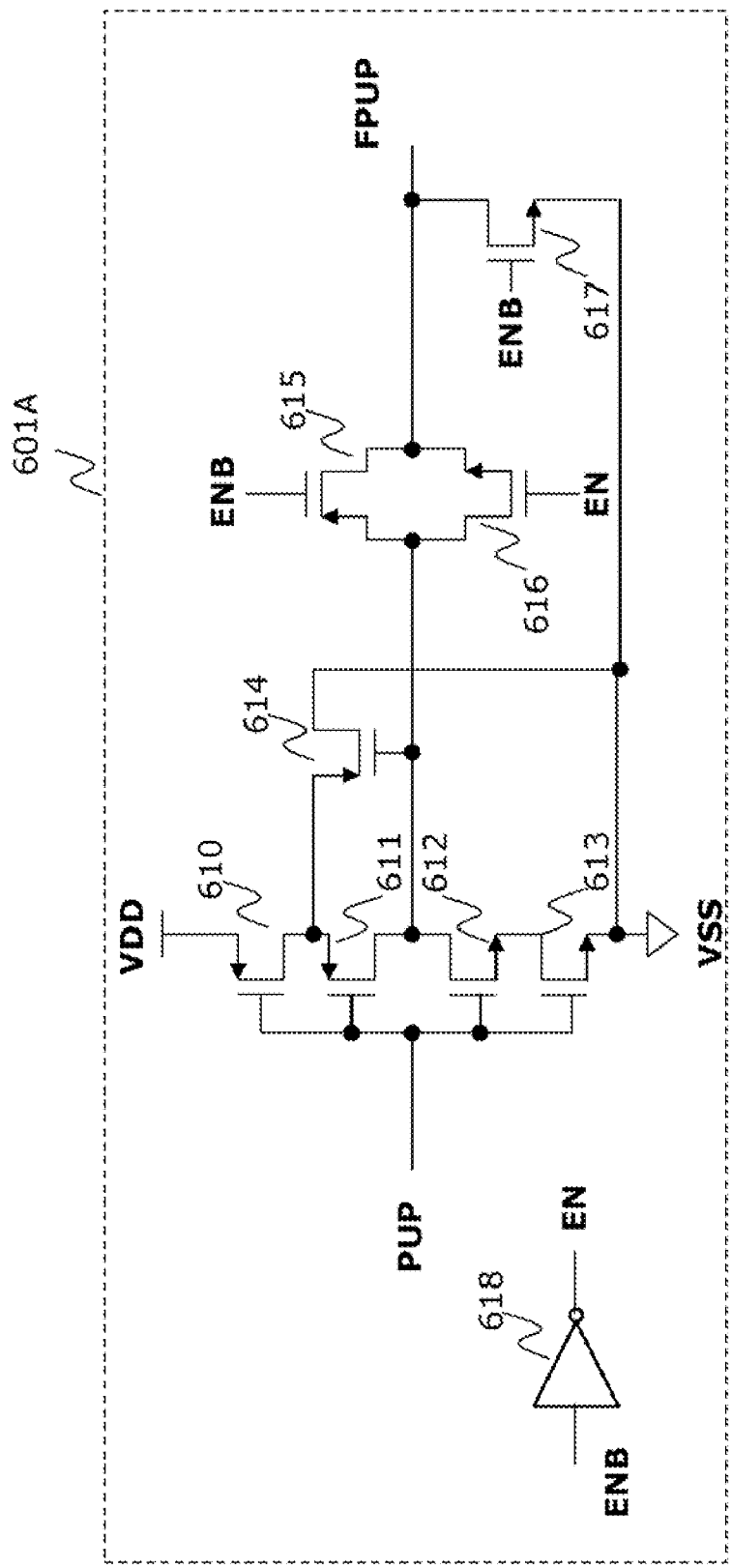
FIGS. 3A and 3B respectively illustrate two Schmitt trigger circuits in the pull-up network and the pull down network in the output buffer circuit of FIG. 2.
Figure 3B:
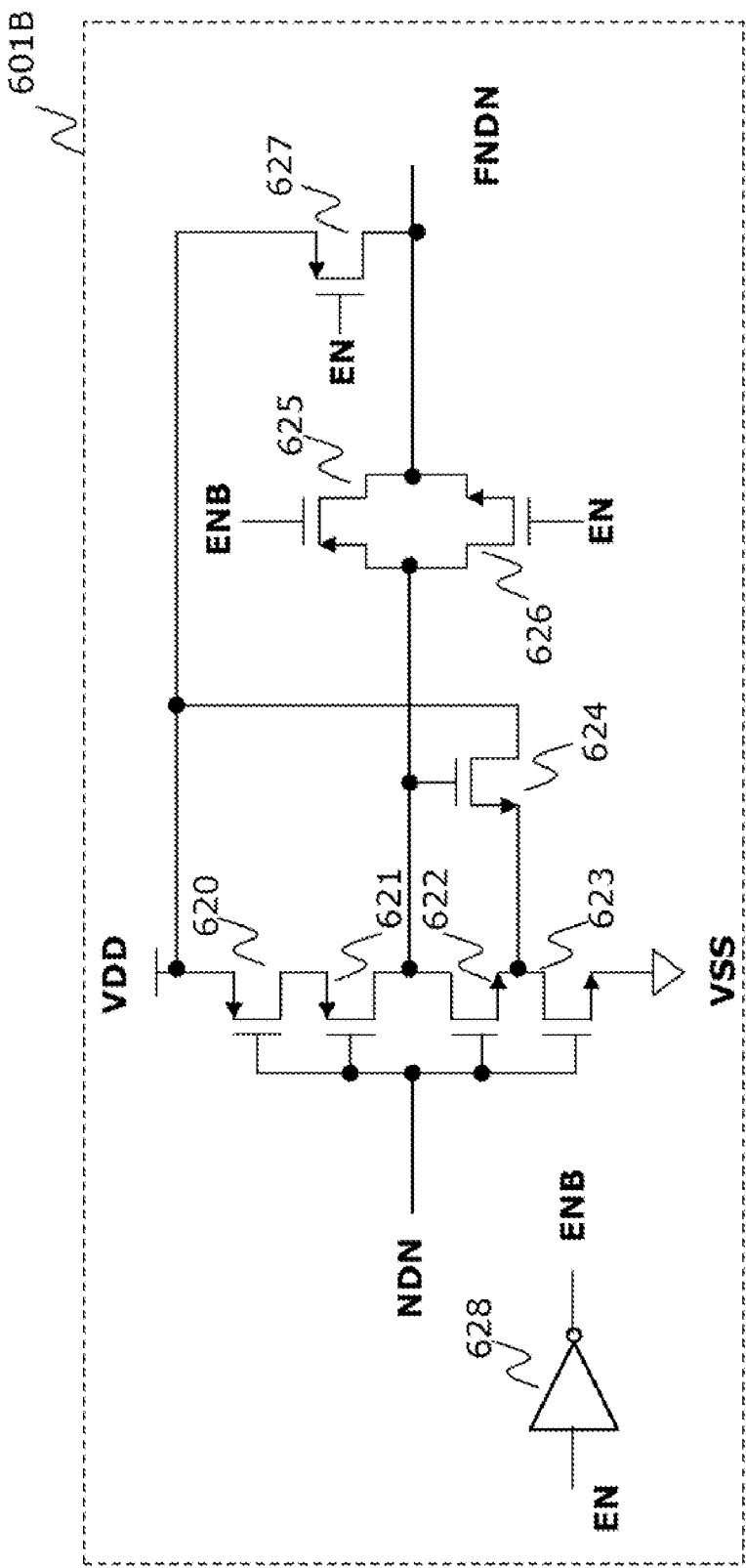

An advantage of the disclosed output buffer 200 is that the pull-up network 600A and the pull-down network 600B can be easily added to the output buffer 100 to perform slew rate control and crowbar current control. The pull-up network 600A and the pull-down network 600B can also be easily removed from the output buffer 200, which allows register-controlled by microcontrollers or microprocessors and increases circuit flexibility. The pull-up network 600A and the pull-down network 600B can be controlled by one or more registers. The registers can turn on and turn off the pull-up network 600A and the pull-down network 600B by controlling the enable control and the transmission gate(s). The pull-up network 600A and the pull-down network 600B can then be bypassed while still allowing the rest of the output buffer to perform (albeit incomplete) functions. FIGS. 3A and 3B illustrate examples how Schmitt trigger circuits 601A and 601B can be enabled or disabled by EN and ENB signals. The EN and ENB signals can be provided by register control from an internal microprocessor or microcontrollers, or from external terminals.

Figure 6:
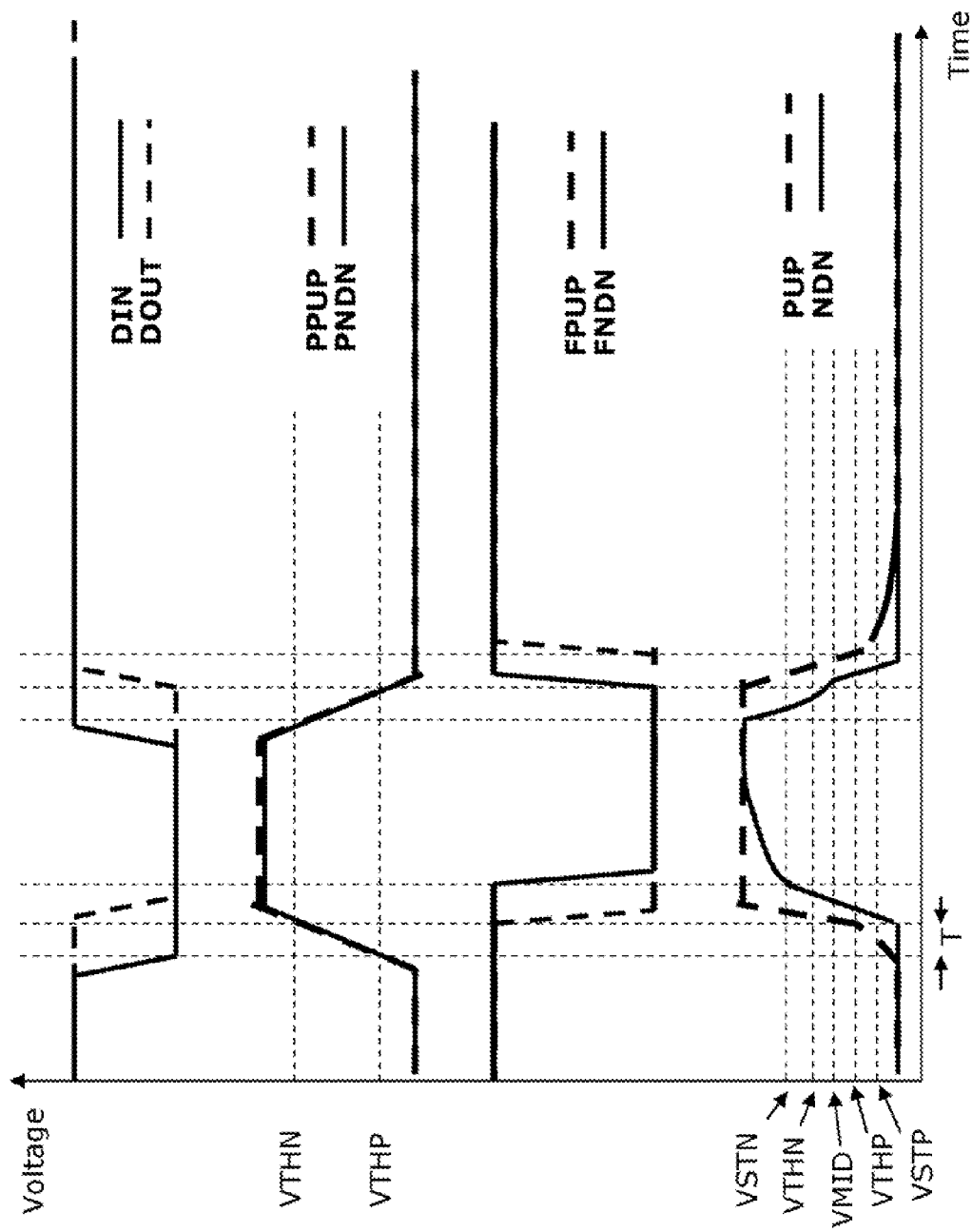
FIG. 6 illustrates waveform diagrams for the output buffer circuit in FIG. 2.

The Schmitt trigger circuits 601A and 601B are used to provide slew rate control for the gate nodes of PMOS transistor 131 and the NMOS transistor 132. Referring to FIG. 3A, the Schmitt trigger circuit 601A includes PMOS transistors 610, 611, and 614, and NMOS transistors 612, 613. The Schmitt trigger circuit 601A can provide hysteresis when the input PUP switches from high to low, but does not provide hysteresis when the input PUP switches from low to high. The Schmitt trigger circuit 601A includes an enable control at a transmission gate formed by a PMOS transistor 615 and a NMOS transistor 616. The Schmitt trigger circuit 601A also includes a disabled NMOS transistor 617. The Schmitt trigger circuit 601A is characterized by a hysteretic switching threshold VSTP for high to low input, and a hysteretic switching threshold VMID for low to high input. For the Schmitt trigger circuit 601A, VMID can be defined as VDD/2. VSTP can be at a voltage level lower than VDD/2 but higher than VSS (as shown in FIG. 6). When ENB is logic low, the Schmitt trigger circuit 601A is enabled. The logic levels of the signal PUP can be transferred to FPUP with the logic inverted under different threshold switching. When ENB is logic high, the Schmitt trigger circuit 601A is disabled and PUP input is shielded from FPUP. FPUP stays low being held down by the NMOS transistor 617.

Referring to FIG. 3B, the Schmitt trigger circuit 601B includes PMOS transistors 620, 621 and NMOS transistors 622, 623, 624. Opposite to The Schmitt trigger circuit 601A, the Schmitt trigger circuit 601B can provide hysteresis when the input signal NDN switches from low to high, which providing no hysteresis for input NDN's switching from high to low. The Schmitt trigger circuit 601B includes an enable control at a transmission gate formed by a PMOS transistor 625 and a NMOS transistor 626. The Schmitt trigger circuit 601B also includes a disabled NMOS transistor 627. The Schmitt trigger circuit 601B is characterized by a hysteretic switching threshold VSTN for low to high NDN input, and a hysteretic switching threshold VMID for high to low input For the Schmitt trigger circuit 601B, VMID can be defined as VDD/2. VSTN can be defined as a voltage level higher than VDD/2 but lower than VDD (as shown in FIG. 6). When EN is logic high, the Schmitt trigger circuit 601B is enabled. The logic levels of NDN can be transferred to FNDN with the inverted logic levels. When EN is at logic low, the Schmitt trigger circuit 601B is disabled. The NDN input is shielded from FNDN. FNDN stays high under the pulling of the PMOS transistor 627.

The Schmitt trigger circuits 601A and 601B can respectively provide slew rate control for the gate nodes of PMOS transistor 131 and the NMOS transistor 132 by enabling or disabling the buffer circuits 602A and 602B in response to the signals PUP and NDN. The slew rate control is implemented through the voltage detection of the signals PUP and NDN through pre-defined threshold voltages VSTP, VSTN and VMID. The threshold voltage level VSTP, VSTN, and VMID can be flexibility changed depending on the requirements of different applications so that the slew rate can be properly controlled. Since the Schmitt trigger circuits 601A and 601B do not drive the output transistors and are thus not required to carry large currents, their sizes can be made very small. The threshold voltages can be kept substantially independent of temperature because a threshold voltage depends on the ratio of transistors' conductance and the temperature dependence in the conductance can be cancelled out between the denominator and the numerator (as well known in the art).

The buffer circuits 602A, 603A and the buffer circuits 602B, 603B play the important roles of the crowbar current control as well as the slew rate control for the output transistors 130. In order to minimize crowbar current through the output transistors, a "break-before-make" circuitry can be provided in an output buffer circuit to prevent both output transistors to be turned on simultaneously. A conventional "break-before-make" circuitry usually shuts off one output transistor first and turns on another output transistor after a delay provided by a set of delay cells. The set of delay cells, however, can dramatically increase the area of the output buffer. The large area of the delay cells makes it difficult for them to be integrated into the output buffer. In the presently disclosed output buffer 200, a break-before-make circuit is implemented by changing the switching threshold voltages of the buffer circuits 602A/603A and 602B/603B without the extra delay cells and the associated large increase in the circuit area in the output buffer.

Figure 4A:
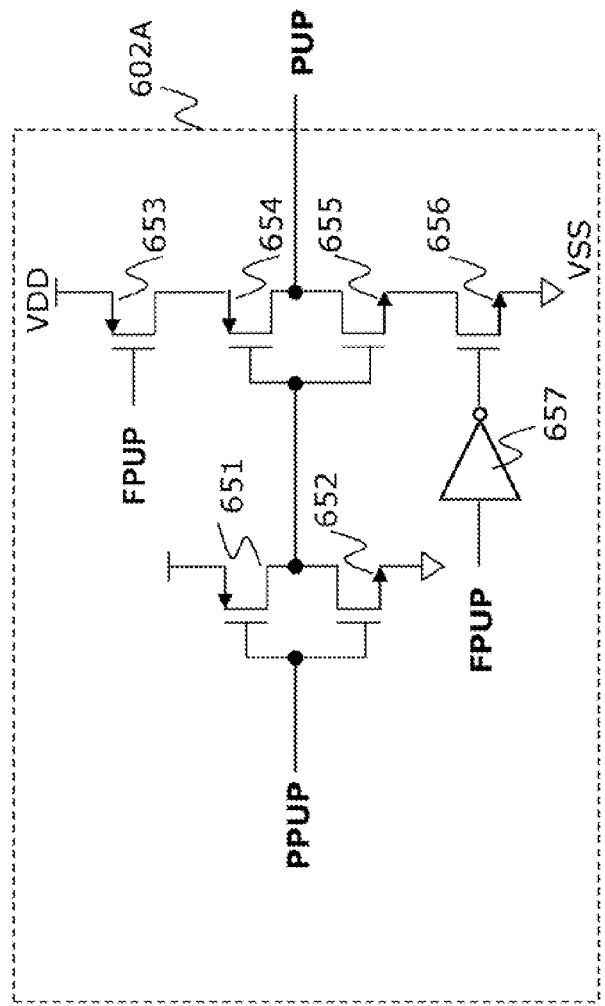
FIGS. 4A and 4B respectively illustrate two buffer circuits in the pull-up network and the pull down network in the output buffer circuit of FIG. 2.

Referring to FIG. 4A, the buffer circuit 602A includes two sequentially connected inverters: a first inverter having a PMOS transistor 651 and an NMOS transistor 652, and a second inverter having a PMOS transistor 654 and an NMOS transistor 655. The control signal ENB is provided by FPUP from the buffer circuit 601A. The control signal EN is the inversion of the signal ENB. Enable controls are provided by a PMOS transistor 653 (controlled by ENB) and an NMOS transistors 656 (controlled by EN) connecting between the second inverter and the voltage supply terminals VDD and VSS. When ENB is logic low, the buffer circuit 602A is enabled and PUP follows a PPUP. When ENB is logic high, the buffer circuit 602A is disabled and PUP is of high-impedance.

The switching threshold voltage for the first inverter is designed to be VTHP (the threshold voltage of the PMOS transistor 651), which is lower than VDD/2. The switching threshold voltage for the first inverter is dependent on the trans-conductance ratio of the PMOS transistor 651 and the NMOS transistor 652. The trans-conductance of the NMOS transistor 652 is selected to be larger than that of the PMOS transistor 651 to allow VTHP below VDD/2. The trans-conductance of the PMOS transistors 653/654 is designed smaller than that of the NMOS transistors 655/656 in the second inverter to provide a fast falling rate in PUP for turning on the output transistor 131 and a slower rising rate for turning off the output transistor 131.

Figure 5A:
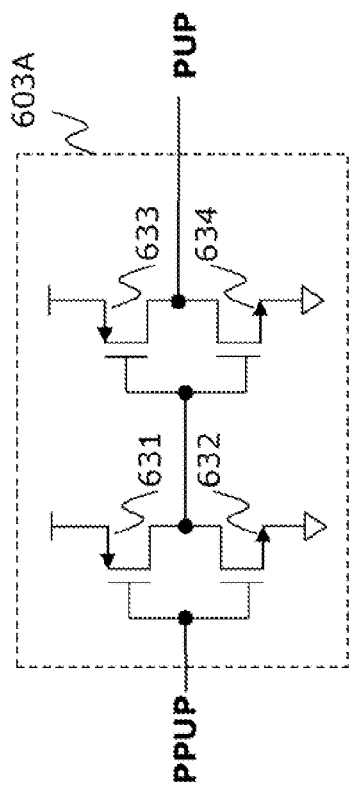
FIGS. 5A and 5B respectively illustrate two buffer circuit with enable control in the pull-up network and the pull down network in the output buffer circuit of FIG. 2.

Referring to FIG. 5A, the buffer circuit 603A also includes two sequentially connected inverters but without enable controls: a first inverter having a PMOS transistor 631 and an NMOS transistor 632, and a second inverter having a PMOS transistor 633 and an NMOS transistor 634. The logic level of PUP follows that of PPUP. The switching threshold voltage of the first inverter is designed to be VTHP below VDD/2, which is substantially the same as the switching threshold of the buffer circuit 602A. The switching threshold voltage is dependent on the trans-conductance ratio of the PMOS transistor 631 and the NMOS transistor 632 with the trans-conductance of the NMOS transistor 632 larger than that of the PMOS transistor 631. The trans-conductance of the PMOS transistor 633 in the second inverter can be designed much larger than that of the NMOS transistor 634 to provide a slow falling rate of PUP for turning on the output transistor 131 and a faster rising rate for turning off the output transistor 131.

The output buffer 603A is designed to turn off the PMOS transistor 131 quickly. The output buffer 602A is designed to turn on the PMOS transistor 131 quickly. The output buffers 602A and 603A can include at least two different functions. First, there are two inverters in the output buffer 602A or 603A. Their first inverters are designed to switch at the same threshold voltage for the signal PPUP to provide same switching delay. However, the second inverters in the output buffer 602A and 603A are designed differently. The second inverter in 602A is designed to provide fast turn on for the PMOS transistor 131. The second inverter in 603A is designed to provide fast turn off for the PMOS transistor 131 since the output buffer 603A is continuously enabled while the output buffer 602A is enabled only when the enable signal is high. The output buffer 602A shuts off after providing a fast turn on for output PMOS. The final turn on will be accomplished by the output buffer 603A. As a result, the PUP can have two different slopes during logic level changes in DIN, which is responsible for the slew rate control.

Figure 4B:
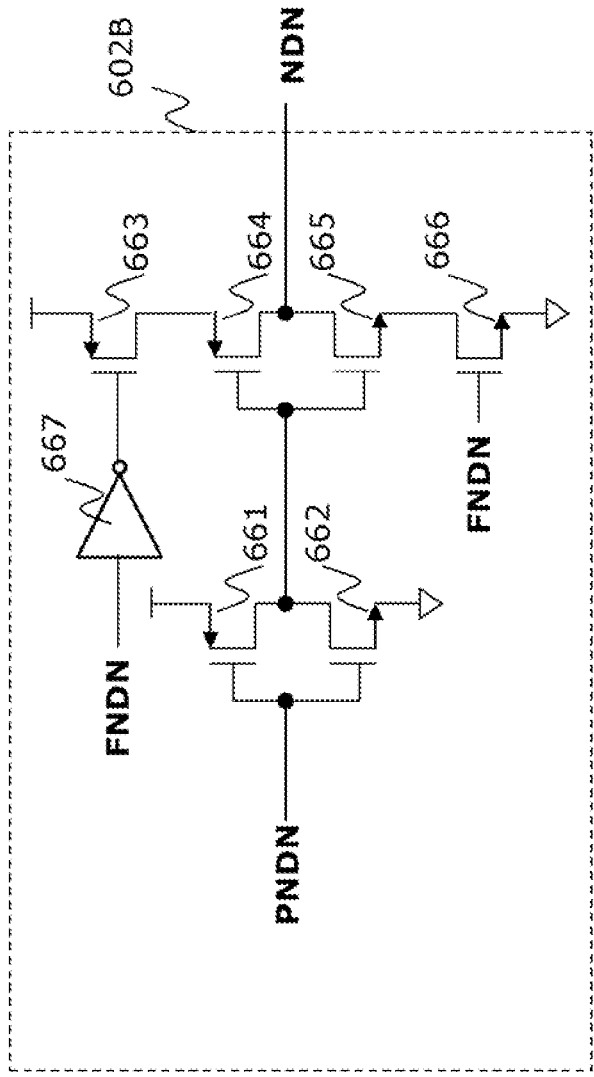

Referring to FIG. 4B, the buffer circuit 602B is symmetrically designed relative to the buffer circuit 602A. The buffer circuit 602B also includes two sequentially connected inverters: a first inverter having a PMOS transistor 661 and an NMOS transistor 662, and a second inverter having a PMOS transistor 664 and an NMOS transistor 665. The control signal EN is provided by FNDN from the buffer circuit 601B. The control signal ENB is the inversion of the signal EN. Enable controls are provided by a PMOS transistor 663 (controlled by ENB) and an NMOS transistors 666 (controlled by EN) connecting between the second inverter and the voltage supply terminals VDD and VSS. When ENB is logic low, the buffer circuit 602B is enabled and NDN follows PNDN. When ENB is logic high, the buffer circuit 602B is disabled and NDN is of high-impedance.

The switching threshold voltage for the first inverter is designed to be VTHN (the threshold voltage of the NMOS transistor 662), which is higher than VDD/2. The switching threshold voltage for the first inverter is dependent on the trans-conductance ratio of the PMOS transistor 661 and the NMOS transistor 662. The trans-conductance of the PMOS transistor 661 is designed to be larger than that of the NMOS transistor 662 to allow VTHN above VDD/2. The trans-conductance of the PMOS transistors 663/664 is designed larger than that of the NMOS transistors 655/666 in the second inverter to provide a fast rising rate in NDN for turning on the output transistor 132 and a slower falling rate for turning off the output transistor 132.

Figure 5B:
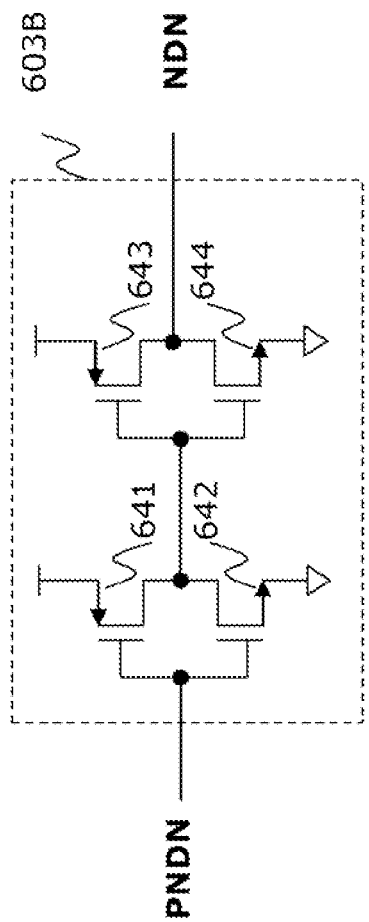

Referring to FIG. 5B, the buffer circuit 603B also includes two sequentially connected inverters but without enable controls: a first inverter having a PMOS transistor 641 and an NMOS transistor 642, and a second inverter having a PMOS transistor 643 and an NMOS transistor 644. The logic level of NDN follows that of PNDN. The switching threshold voltage of the first inverter is designed to be VTHN above VDD/2, which is substantially the same as the switching threshold of the buffer circuit 602B. The switching threshold voltage is dependent on the trans-conductance ratio of the PMOS transistor 641 and the NMOS transistor 642 with the trans-conductance of the NMOS transistor 642 larger than that of the PMOS transistor 641. The trans-conductance of the PMOS transistor 643 can be designed much larger than that of the NMOS transistor 644 to provide a slow rising rate for NDN for turning on the output transistor 132 and faster falling rate for turning off the output transistor 132.

The pull-up network 600A and the pull-down network 600B include five different threshold voltages VSTN, VTHN, VMID, VTHP and VSTP, with their voltage levels in the sequence of VTHN>VMID>VTHP, as shown in FIG. 6. Optionally but not required, VSTN can be designed to be higher than VTHN. VSTP can be designed to be lower than VTHP.

When EN is logic low, the output buffer 200 is disabled. PPUP stays high and PNDN stays low. PUP stays high and NDN stays low. The DOUT is of high-impedance.

When EN is logic high, the output buffer 200 is enabled. As shown in FIG. 6, when DIN first switches from logic high to logic low, the output of the inverter gate 104 switches from logic low to logic high; the output of NOR gate 102 switches from logic high to logic low. The output of the NAND gate 103 switches from logic high to logic low. The output signals from the NOR gate 102 and the NAND gate 103 are respectively inverted by the inverters 121 and 122 to produce PPUP and PNDN. Both PPUP and PNDN switch from logic low to logic high. As can be seen, PPUP and PNDN voltage pulses are close to each other in time. The PPUP and PNDN signals are not controlled in neither slew rate nor crowbar current. If such signals were directly fed to the output transistors 130, large crowbar current can be produced. Large voltage spike will also result at VDD, VSS, and the output pad 140.

To avoid such situation, VTHP is designed to be much lower than VTHN to cause the buffer circuits 602A and 603A to switch before and the buffer circuits 602B and 603B. When PPUP starts rising from zero voltage and reaches VTHP, PUP starts switching fast from logic low to logic high through the buffer circuit 603A to shut off the output PMOS transistor 131 as the buffer circuit 603A is designed to have faster rising rate. The buffer circuit 602A has not yet switched as FPUP remains at logic high, which disables the buffer circuit 602A.

When PUP starts rising from zero voltage and continues to reach VMID, the output voltage of the Schmitt trigger circuit 601A switches from logic high to logic low and starts enabling buffer circuit 602A and further drives PUP signal harder to logic high. However, as described, the rising rate of the buffer circuit 603A is not as strong as that of the buffer circuit 602A. The major shutting off mechanism for the output PMOS transistor 131 is therefore fulfilled by the buffer circuit 603A instead of the buffer circuit 602A. The buffer circuit 603A switches first and faster. The buffer circuit 602A is primarily used to drive hard to turn on output PMOS transistor 131 while 603A is primarily used to drive hard to turn off output PMOS transistor 131.

When PNDN reaches VTHN, NDN starts to switch from logic low to logic high by both buffer circuits 602B and 603B as it is shown since FNDN is logic high. As both buffer circuits 602B and 603B are turned on, the rising rate of NDN becomes strongest as the rising rate of NDN is primarily dominated by the buffer circuit 602B instead of 603B as 602B has been designed to provide stronger rising rate of NDN, meaning stronger turning on rate, the same function as that of buffer circuit 602A. Similar to the buffer circuit 603A, the buffer circuit 603B is primarily used to provide stronger turning off of NDN. Therefore, by differentiating the switching threshold between VTHP and VTHN, PUP is already pulled high and completely shut off the output PMOS transistor 131 before NDN is pulled high to turn on the output NMOS transistor 132. In other words, a break-before-make circuit is implemented by using different threshold voltages. Crowbar current in data switching from logic high to logic low is drastically reduced or eliminated. When NDN continues to reach further to VSTN, the output voltage of the Schmitt trigger circuit 601B switches from logic high to logic low and shut off the stronger buffer circuit 602B. As a result, the rising rate of NDN becomes much slower. The slower rising rate can reduce the current sinking rate from the pad 140 to VSS. As the current sinking rate reduces, the rate of change dI/dT for the current from the pad 140 to VSS becomes smaller and so does the dV/dT. The voltage spike at VDD, VSS, and the pad 140 are drastically reduced or eliminated.

When DIN switches from logic low to logic high, the output of the inverter gate 104 switches from logic high to logic low. The output of the NOR gate 102 switches from logic low to logic high and also the output of the NAND gate 103 switches from logic low to logic high. The output signals from the NOR gate 102 and the NAND gate 103 are inverted by the inverters 121 and 122 to produce PPUP and PNDN that switch from logic high to logic low.

VTHN is designed to be much higher than VTHP. The buffer circuits 602B and 603B switch first before the switching of the buffer circuits 602A and 603A. When PNDN falls from VDD voltage to reach VTHN, NDN starts switching fast from logic high to logic low through the buffer circuit 603B to shut off output NMOS transistor 132 as the buffer circuit 603B is designed to have fast falling rate. The buffer circuit 602B has not yet switched as FNDN remains logic low and disables buffer circuit 602B. When NDN falls from VDD to reach VMID, the output voltage of the Schmitt trigger circuit 601B switches from logic low to logic high and starts enabling buffer circuit 602B and drives NDN signal harder to logic low. As described, the falling rate of the buffer circuit 603B is as fast as that of the buffer circuit 602B. The major shutting off of the output NMOS transistor 132 is fulfilled by the buffer circuit 603B instead of 602B. The buffer circuit 603B switches first and switches fast. The buffer circuit 603 is primarily used to drive hard to turn on the output NMOS transistor 132 while the buffer circuit 603B is primarily used to drive hard to turn off the output NMOS transistor 132.

When PPUP reaches VTHP, PUP switches from logic high to logic low driven by buffer circuits 602A and 603A as it is shown since FPUP is logic low. As both buffer circuits 602A and 603A are turned on, PUP falls fast because the falling rate of PUP is primarily fulfilled by the buffer circuit 602A instead of the buffer circuit 603A. Similar to the buffer circuit 603B, the buffer circuit 603A is primarily used to provide stronger turning off of PUP. It can be seen that NDN signal is already pulled low and the output NMOS transistor 132 is completely shut off before PUP signal is pulled low to turn on output PMOS transistor 131. The crowbar current during DIN switch from logic low to logic high is minimized or eliminated by differentiating the switching threshold voltages VTHN and VTHP.

When PUP falls further to VSTP, the output voltage of the Schmitt trigger circuit 601A switches from logic low to logic high and shut off the stronger buffer circuit 602A. In response, the falling rate of PUP becomes slower. The slower falling rate can reduce the current sourcing rate from VDD to the pad 140. As the current sourcing rate reduces, the rate change dV/dT (i.e. the slew rate) for the current from VDD to the pad 140 is decreased. The voltage spike at VDD, VSS, and the pad 140 are drastically reduced or eliminated.

In summary, for logic-level changes (a switch from logic low to logic high or vice versa) at DIN, crowbar current can be minimized or eliminated by properly designing the threshold voltages VTHP and VTHN for the buffer circuits 602A/603A and 602B/603B. The larger the difference between VTHP and VTHN, the wider the time separation between the voltage changes in PUP and DND. Additionally, the output slew rate is controlled by designing VSTP and VSTN to timely shut off the buffer circuit 602A/602B to slower down the falling or rising slew rate in the input to the output transistors 130, which can minimize or eliminate voltage spikes at the voltage supply terminals and the output pad. The circuit and threshold voltages in the pull-up network 600A and the pull-down network 600B have simple designs. The pull-up network 600A and the pull-down network 600B can be easily integrated or removed from the original art and yet the circuit is area efficient.

The disclosed circuits and methods may have one or more of the following advantages. An advantage of the disclosed pre-driver circuit for output buffer is that it can simultaneously control slew rate and crowbar current in a CMOS output buffer. The disclosed pre-driver circuit for CMOS output buffer has a simple design and is easy to implement. The disclosed pre-driver circuit can also be easily integrated with or removed from an existing output buffer circuit. The present pre-driver can be register-controlled by a microprocessor or a microcontroller independently without affecting normal function of output buffer. The disclosed pre-driver circuit for CMOS output buffer can be implemented in small component areas, which is beneficial for high-density integrated circuit. Another advantage of disclosed the pre-driver circuit is that the disclosed pre-driver circuit for CMOS output buffer can be implemented using only digital components, which can alleviate the need for precise analog components in some conventional output buffer. Another advantage of disclosed the pre-driver circuit is that the operations of the disclosed pre-driver circuit do not require precise control of the absolute values for the buffer thresholds and the Schmitt trigger thresholds. Only the relative sequence of the threshold voltages and the voltage differences between the threshold voltages need to be controlled.

It is understood that the disclosed circuit and methods are compatible with other configurations of the electronic components and variations in circuit designs without deviation from the spirit of the present specification. Various forms of resisters, capacitors, transistors, and amplifiers can be used to achieve similar results as described above. The inverters, the Schmitt trigger circuit, and the enable controls can be based on other logic gate designs that are Boolean equivalents and that can perform similar functions.

The present invention is described above with reference to exemplary embodiments. It will be apparent to those skilled in the art that various modifications may be made and other embodiments can be used without departing from the broader scope of the present invention. Therefore, these and other variations upon the exemplary embodiments are intended to be covered by the present invention.

What is claimed is:

1. An output buffer having slew-rate control and crossbar current control, comprising:
   a pull-up PMOS transistor coupled to a high voltage supply terminal VDD and having a gate configured to receive a signal PUP;
   a pull-down NMOS transistor arranged between and the pull-up PMOS transistor and a low-voltage supply terminal VSS, wherein the gate of the pull-down NMOS transistor is configured to receive a signal NDN;
   a pull-up network coupled to the gate of the pull-up PMOS transistor, wherein the pull-up network comprises:
      a first logic gate circuit having a threshold voltage VTHP for an input signal PPUP and configured to produce at least a portion of PUP;
      a first Schmitt trigger circuit configured to receive PUP as an input and output a signal FPUP, wherein the first Schmitt trigger circuit has a switching threshold voltage VSTP for PUP; and
      a second logic gate circuit having a threshold voltage substantially at VTHP for the input signal PPUP and configured to produce at least a portion of PUP, wherein the second logic circuit is enable controlled by the signal FPUP; and
   a pull-down network coupled to the gate of the pull-down NMOS transistor, wherein the pull-down network comprises:
      a third logic gate circuit having a threshold voltage VTHN for an input signal PNDN and configured to produce at least a portion of NDN;
      a second Schmitt trigger circuit configured to receive NDN as an input and output a signal FNDN, wherein the second Schmitt trigger circuit has a switching threshold voltage VSTN for NDN; and
      a fourth logic gate circuit having a threshold voltage substantially at VTHN and an output connected to the gate of the pull-down NMOS transistor, wherein the fourth logic circuit is enable controlled by the signal FNDN.

2. The output buffer of claim 1, wherein the threshold voltages VTHN and VTHP satisfy the relationship: VTHN>VTHP.

3. The output buffer of claim 2, wherein the middle voltage between the high voltage supply terminal VDD and the low-voltage supply terminal VSS is VMID, and wherein the threshold voltages VTHN and VTHP satisfy the relationship: VTHN>VMID>VTHP.

4. The output buffer of claim 1, wherein the switching threshold voltage VSTP for the first Schmitt trigger circuit and the switching threshold voltage VSTN for the second Schmitt trigger circuit satisfy the relationship: VSTN>VSTP.

5. The output buffer of claim 4, wherein the middle voltage between the high voltage supply terminal VDD and the low-voltage supply terminal VSS is VMID, and wherein the switching threshold voltage VSTP and the switching threshold voltage VSTN satisfy the relationship: VSTN>VMID>VSTP.

6. The output buffer of claim 1, wherein VSTN, VTHN, VTHP, and VSTP satisfy the relationship: VSTN>VTHN>VTHP>VSTP.

7. The output buffer of claim 1, wherein the first logic gate circuit comprises:
   a first inverter having the threshold voltage VTHP; and
   a second inverter sequentially connected with the first inverter, wherein the second inverter includes an output connected to the gate of the pull-up PMOS transistor.

8. The output buffer of claim 1, wherein the second logic gate circuit comprises:
   a first inverter having the threshold voltage VTHP; and
   a second inverter sequentially connected with the first inverter, wherein the second inverter includes an output connected to the gate of the pull-up PMOS transistor, and wherein the second inverter is connected between the high voltage supply terminal VDD and the low-voltage supply terminal VSS via one or more transistors that are controlled by the signal FPUP.

9. The output buffer of claim 1, wherein the third logic gate circuit comprises:
   a first inverter having the threshold voltage VTHN; and
   a second inverter sequentially connected with the first inverter, wherein the second inverter includes an output connected to the gate of the pull-down NMOS transistor.

10. The output buffer of claim 1, wherein the fourth logic gate circuit comprises:
    a first inverter having the threshold voltage VTHN; and
    a second inverter sequentially connected with the first inverter, wherein the second inverter includes an output connected to the gate of the pull-down NMOS transistor, and wherein the second inverter is connected between the high voltage supply terminal VDD and the low-voltage supply terminal VSS via one or more transistors that are controlled by the signal FNDN.

11. The output buffer of claim 1, wherein at least one of the first Schmitt trigger circuit or the second Schmitt trigger circuit is configured to be enabled or disabled by an external enable signal EN.

12. The output buffer of claim 1, further comprising:
    a fifth logic gate circuit configured to receive an input signal DIN and an external enable signal EN, to output a signal PPUP to the first logic gate circuit and the second logic gate circuit, and a output the signal PNDN to the third logic gate circuit and the fourth logic gate circuit; and
    an output pad connected to the pull-up PMOS transistor and the pull-down NMOS transistor, wherein the output pad is configured to provide output signal DOUT adapted to an external load in response to the input signal DIN and the external enable signal EN.

13. The output buffer of claim 1, wherein when DIN changes from logic high to logic low, the first logic gate circuit and the second logic gate circuit are configured to turn off the pull-up PMOS transistor before the third logic gate circuit and the fourth logic gate circuit turn on the pull-down NMOS transistor.

14. The output buffer of claim 1, wherein when DIN changes from logic low to logic high, the third logic gate circuit and the fourth logic gate circuit are configured to turn off the pull-down NMOS transistor before the first logic gate circuit and the second logic gate circuit turn on the pull-up PMOS transistor.

15. The output buffer of claim 1, wherein the second Schmitt trigger circuit is configured to shut off the fourth logic gate circuit when NDN exceeds the switching threshold voltage VSTN during a switch from logic high to logic low in DIN.

16. The output buffer of claim 1, wherein the first Schmitt trigger circuit is configured to shut off the second logic gate circuit when NDN falls below the switching threshold voltage VSTP during a switch from logic low to logic high in DIN.

17. An output buffer having slew-rate control and crossbar current control, comprising:
- a pull-up PMOS transistor coupled to a high voltage supply terminal VDD and having a gate configured to receive a signal PUP;
- a pull-down NMOS transistor arranged between and the pull-up PMOS transistor and a low-voltage supply terminal VSS, wherein the gate of the pull-down NMOS transistor is configured to receive a signal NDN;
- a pull-up network coupled to the gate of the pull-up PMOS transistor, wherein the pull-up network comprises:
  - a first logic gate circuit having a threshold voltage VTHP for an input signal PPUP and configured to produce at least a portion of PUP;
  - a first Schmitt trigger circuit configured to receive PUP as an input and output a signal FPUP, wherein the first Schmitt trigger circuit has a switching threshold voltage VSTP for PUP; and
  - a second logic gate circuit having a threshold voltage substantially at VTHP for the input signal PPUP and configured to produce at least a portion of PUP, wherein the second logic circuit is enable controlled by the signal FPUP; and
- a pull-down network coupled to the gate of the pull-down NMOS transistor, wherein the pull-down network comprises:
  - a third logic gate circuit having a threshold voltage VTHN for an input signal PNDN and configured to produce at least a portion of NDN;
  - a second Schmitt trigger circuit configured to receive NDN as an input and output a signal FNDN, wherein the second Schmitt trigger circuit has a switching threshold voltage VSTN for NDN; and
  - a fourth logic gate circuit having a threshold voltage substantially at VTHN and an output connected to the gate of the pull-down NMOS transistor, wherein the fourth logic circuit is enable controlled by the signal FNDN,
- wherein when DIN changes from logic high to logic low, the first logic gate circuit and the second logic gate circuit are configured to turn off the pull-up PMOS transistor before the third logic gate circuit and the fourth logic gate circuit turn on the pull-down NMOS transistor, and wherein when DIN changes from logic low to logic high, the third logic gate circuit and the fourth logic gate circuit are configured to turn off the pull-down NMOS transistor before the first logic gate circuit and the second logic gate circuit turn on the pull-up PMOS transistor.

18. The output buffer of claim 17, wherein the second Schmitt trigger circuit is configured to shut off the fourth logic gate circuit when NDN exceeds the switching threshold voltage VSTN during a switch from logic high to logic low in DIN, and wherein the first Schmitt trigger circuit is configured to shut off the second logic gate circuit when NDN falls below the switching threshold voltage VSTP during a switch from logic low to logic high in DIN.

19. An output buffer having slew-rate control and crossbar current control, comprising:
- a pull-up PMOS transistor coupled to a high voltage supply terminal VDD and having a gate configured to receive a signal PUP;
- a pull-down NMOS transistor arranged between and the pull-up PMOS transistor and a low-voltage supply terminal VSS, wherein the gate of the pull-down NMOS transistor is configured to receive a signal NDN;
- a pull-up network coupled to the gate of the pull-up PMOS transistor, wherein the pull-up network comprises:
  - a first logic gate circuit having a threshold voltage VTHP for an input signal PPUP and configured to produce at least a portion of PUP;
  - a first Schmitt trigger circuit configured to receive PUP as an input and output a signal FPUP, wherein the first Schmitt trigger circuit has a switching threshold voltage VSTP for PUP; and
  - a second logic gate circuit having a threshold voltage substantially at VTHP for the input signal PPUP and configured to produce at least a portion of PUP, wherein the second logic circuit is enable controlled by the signal FPUP; and
- a pull-down network coupled to the gate of the pull-down NMOS transistor, wherein the pull-down network comprises:
  - a third logic gate circuit having a threshold voltage VTHN for an input signal PNDN and configured to produce at least a portion of NDN;
  - a second Schmitt trigger circuit configured to receive NDN as an input and output a signal FNDN, wherein the second Schmitt trigger circuit has a switching threshold voltage VSTN for NDN; and
  - a fourth logic gate circuit having a threshold voltage substantially at VTHN and an output connected to the gate of the pull-down NMOS transistor, wherein the fourth logic circuit is enable controlled by the signal FNDN,
- wherein the threshold voltages VTHN and VTHP satisfy the relationship: VTHN>VTHP and the switching threshold voltages VSTP and VSTN satisfy the relationship: VSTN>VSTP, wherein the second Schmitt trigger circuit is configured to shut off the fourth logic gate circuit when NDN exceeds the switching threshold voltage VSTN during a switch from logic high to logic low in DIN, and wherein the first Schmitt trigger circuit is configured to shut off the second logic gate circuit when NDN falls below the switching threshold voltage VSTP during a switch from logic low to logic high in DIN.

20. The output buffer of claim 19, wherein when DIN changes from logic high to logic low, the first logic gate circuit and the second logic gate circuit are configured to turn off the pull-up PMOS transistor before the third logic gate circuit and the fourth logic gate circuit turn on the pull-down NMOS transistor, and wherein when DIN changes from logic low to logic high, the third logic gate circuit and the fourth logic gate circuit are configured to turn off the pull-down NMOS transistor before the first logic gate circuit and the second logic gate circuit turn on the pull-up PMOS transistor.

* * * * *